(12) United States Patent
Chow et al.

(10) Patent No.: US 9,030,006 B2
(45) Date of Patent: May 12, 2015

(54) INTEGRATED CIRCUIT PACKAGE SYSTEM WITH INTERNAL STACKING MODULE

(75) Inventors: Seng Guan Chow, Singapore (SG); Heap Hoe Kuan, Singapore (SG); Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/563,598

(22) Filed: Jul. 31, 2012

(65) Prior Publication Data

US 2012/0292750 A1 Nov. 22, 2012

Related U.S. Application Data

(63) Continuation of application No. 12/137,529, filed on Jun. 11, 2008, now Pat. No. 8,278,141.

(51) Int. Cl.
| | |
|---|---|
| *H01L 23/34* | (2006.01) |
| *H01L 23/31* | (2006.01) |
| *H01L 21/56* | (2006.01) |
| *H01L 23/552* | (2006.01) |
| *H01L 25/03* | (2006.01) |
| *H01L 25/065* | (2006.01) |
| *H01L 25/10* | (2006.01) |
| *H01L 25/16* | (2006.01) |
| *H01L 23/498* | (2006.01) |
| *H01L 23/538* | (2006.01) |
| *H01L 23/00* | (2006.01) |

(52) U.S. Cl.
CPC .......... *H01L 23/3128* (2013.01); *H01L 21/563* (2013.01); *H01L 23/49816* (2013.01); *H01L 23/49827* (2013.01); *H01L 23/5387* (2013.01); *H01L 23/552* (2013.01); *H01L 25/03* (2013.01); *H01L 25/0657* (2013.01); *H01L 25/105* (2013.01); *H01L 2224/48091* (2013.01); *H01L 2224/48227* (2013.01); *H01L 2224/73203* (2013.01); *H01L 2224/73207* (2013.01); *H01L 2224/73215* (2013.01); *H01L 2224/73265* (2013.01); *H01L 2225/06572* (2013.01); *H01L 2225/1041* (2013.01); *H01L 2924/1815* (2013.01); *H01L 2924/19041* (2013.01); *H01L 2924/19105* (2013.01); *H01L 2924/3025* (2013.01); *H01L 24/48* (2013.01); *H01L 2224/16225* (2013.01); *H01L 2924/15311* (2013.01); *H01L 2224/32225* (2013.01); *H01L 2924/19107* (2013.01); *H01L 2225/1088* (2013.01); *H01L 25/16* (2013.01); *H01L 2225/1023* (2013.01); *H01L 2225/1058* (2013.01)

(58) Field of Classification Search
USPC .................. 257/666, 687, 723, 724, 726, 727
See application file for complete search history.

(56) References Cited

U.S. PATENT DOCUMENTS

| | | |
|---|---|---|
| 5,646,446 A | 7/1997 | Nicewarner, Jr. et al. |
| 6,683,377 B1 | 1/2004 | Shim et al. |
| 6,765,288 B2 | 7/2004 | Damberg |
| 6,841,855 B2 | 1/2005 | Jaeck et al. |
| 6,869,825 B2 | 3/2005 | Chiu |

(Continued)

*Primary Examiner* — Jae Lee
(74) *Attorney, Agent, or Firm* — Ishimaru & Associates LLP

(57) ABSTRACT

An integrated circuit package system includes: providing an integrated circuit substrate; forming an internal stacking module coupled to the integrated circuit substrate including: forming a flexible substrate, coupling a stacking module integrated circuit to the flexible substrate, and bending a flexible extension over the stacking module integrated circuit; and molding a package body on the integrated circuit substrate and the internal stacking module.

20 Claims, 6 Drawing Sheets

(56) References Cited

U.S. PATENT DOCUMENTS

| | | |
|---|---|---|
| 6,884,653 B2 | 4/2005 | Larson |
| 6,924,551 B2 | 8/2005 | Rumer et al. |
| 6,933,598 B2 | 8/2005 | Karnezos |
| 6,940,729 B2 | 9/2005 | Cady et al. |
| 6,982,869 B2 | 1/2006 | Larson |
| 7,033,911 B2 | 4/2006 | Manepalli et al. |
| 7,053,478 B2 | 5/2006 | Roper et al. |
| 7,115,986 B2 | 10/2006 | Moon et al. |
| 7,149,095 B2 * | 12/2006 | Warner et al. .......... 361/803 |
| 7,154,171 B1 | 12/2006 | Yoshida |
| 7,154,175 B2 | 12/2006 | Shrivastava et al. |
| 7,183,140 B2 | 2/2007 | Davison et al. |
| 7,205,647 B2 | 4/2007 | Karnezos |
| 7,230,328 B2 | 6/2007 | Hazeyama et al. |
| 7,235,870 B2 | 6/2007 | Punzalan, Jr. et al. |
| 7,358,444 B2 | 4/2008 | Nickerson et al. |
| 7,986,043 B2 * | 7/2011 | Merilo et al. .......... 257/777 |
| 2004/0173902 A1 | 9/2004 | Kim et al. |
| 2004/0209400 A1 | 10/2004 | Meyers |
| 2005/0199971 A1 | 9/2005 | Anderson et al. |
| 2006/0033217 A1 | 2/2006 | Taggart et al. |
| 2006/0077644 A1 | 4/2006 | Nickerson et al. |
| 2006/0138630 A1 | 6/2006 | Bhakta |
| 2006/0226543 A1 | 10/2006 | Kim et al. |
| 2007/0114649 A1 | 5/2007 | Partridge et al. |
| 2007/0187826 A1 | 8/2007 | Shim et al. |
| 2007/0194423 A1 | 8/2007 | Yim et al. |
| 2007/0194463 A1 | 8/2007 | Kim et al. |
| 2008/0006925 A1 | 1/2008 | Yim et al. |
| 2008/0009096 A1 | 1/2008 | Hwang |
| 2008/0029905 A1 | 2/2008 | Merilo et al. |
| 2009/0016032 A1 | 1/2009 | Chow et al. |
| 2009/0016033 A1 | 1/2009 | Chow et al. |
| 2009/0115032 A1 | 5/2009 | Camacho et al. |
| 2009/0206461 A1 | 8/2009 | Yoon |
| 2009/0236753 A1 | 9/2009 | Moon et al. |
| 2009/0243069 A1 * | 10/2009 | Camacho et al. .......... 257/686 |
| 2009/0289335 A1 * | 11/2009 | Camacho et al. .......... 257/659 |

* cited by examiner

ND CIRCUIT PACKAGE SYSTEM
INTEGRATED CIRCUIT PACKAGE SYSTEM WITH INTERNAL STACKING MODULE

CROSS-REFERENCE TO RELATED APPLICATION(S)

This application is a continuation of U.S. patent application Ser. No. 12/137,529 filed Jun. 11, 2008, now U.S. Pat. No. 8,278,141, and the subject matter thereof is incorporated herein by reference thereto.

The present application contains subject matter related to U.S. patent application Ser. No. 12/136,002, filed Jun. 9, 2008, now U.S. Pat. No. 8,050,047. The related application is assigned to STATS ChipPAC Ltd.

The present application also contains subject matter related to U.S. patent application Ser. No. 12/136,007, filed Jun. 9, 2008, now U.S. Pat. No. 8,031,475. The related application is assigned to STATS ChipPAC Ltd.

TECHNICAL FIELD

The present invention relates generally to integrated circuit packaging, and more particularly to a system for multi-chip integrated circuit package stacking.

BACKGROUND ART

Every new generation of integrated circuit having increased operating frequency, performance and the higher level of integration has underscored the need for the integrated circuit packaging to meet the high speed signaling requirements of the new integrated circuits. Modern consumer electronics, such as smart phones, personal digital assistants, and location based services devices, as well as enterprise electronics, such as servers and storage arrays, are packing more integrated circuits into an ever-shrinking physical space with expectations for decreasing cost. Contemporary consumer electronics expose integrated circuits and packages to more demanding and sometimes new environmental conditions, such as cold, heat, and humidity requiring integrated circuit packages to provide robust thermal management structures.

As more functions are packed into the integrated circuits and more integrated circuits into the package, the packaged integrated circuits must reliably provide the high performance across specified environmental conditions. The integrated circuits support a portion of the performance assurance over various conditions. The integrated circuit package also supports a portion of the performance assurance and in some case more than the integrated circuits.

Numerous technologies have been developed to meet these requirements. Some of the research and development strategies focus on new package technologies while others focus on improving the existing and mature package technologies. Research and development in the existing package technologies may take a number of different directions.

One proven way to reduce cost is to use package technologies with existing manufacturing methods and equipment. Paradoxically, the reuse of existing manufacturing processes does not typically result in the reduction of package dimensions. Existing packaging technologies struggle to cost effectively meet the ever-increasing demands of today's integrated circuits and packages.

In response to the demands for improved packaging, many innovative package designs have been brought to market. The multi-chip package has achieved a prominent role in reducing the board space. Many package approaches stack multiple integrated circuits, package level stacking, or package-on-package (POP) stacking are just a few. In these processes known-good-die (KGD) and assembly process yields are not an issue since each package can be tested prior to assembly. But stacking integrated devices, package-on-package, or a combination thereof present system level difficulties, such as increased package height and poor thermal dissipation. Stacked package combinations composed of two ordinary packages or package structures may not be optimal for high performance integrated circuits.

Thus, a need still remains for an integrated circuit package system with internal stacking module providing low cost manufacturing, improved yields, increased electrical performance, reduced integrated circuit package dimensions, and integration configurations. In view of the ever-increasing need to save costs and improve efficiencies, it is more and more critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an integrated circuit substrate; forming an internal stacking module coupled to the integrated circuit substrate including: forming a flexible substrate, coupling a stacking module integrated circuit to the flexible substrate, and bending a flexible extension over the stacking module integrated circuit; and molding a package body on the integrated circuit substrate and the internal stacking module.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
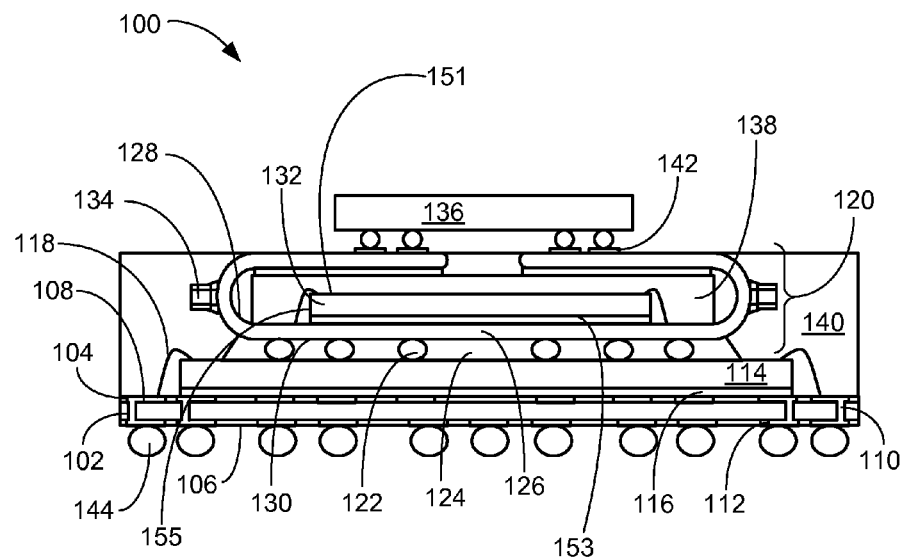
FIG. 1 is a cross-sectional view of an integrated circuit package system with internal stacking module, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package system 100 with internal stacking module, in an embodiment of the present invention. The cross-sectional view of the integrated circuit package system 100 depicts an integrated circuit substrate 102, such as a laminate substrate, a ceramic substrate, or a composite substrate, having a component side 104 and a system side 106. A component contact 108 may be formed on the component side 104 with a via 110 coupling a system contact 112 on the system side 106.

A first integrated circuit 114 may be mounted by an adhesive 116, such as a die attach material, between the inactive side of the first integrated circuit 114 and the component side 104. An electrical interconnect 118 may couple the active side of the first integrated circuit 114 to the component contact 108. An internal stacking module 120 may be coupled to the active side of the first integrated circuit 114 by chip interconnects 122, such as solder balls, solder columns, solder bumps, or stud bumps. An underfill material 124 may optionally be applied between the active side of the first integrated circuit 114 and the internal stacking module 120.

The internal stacking module 120 may be formed by a flexible substrate 126 having a first side 128 and a second side 130. The first side 128 and the second side 130 may provide an electrical connection path between a stacking module integrated circuit 132, such as a wire bond type of integrated circuit, a discrete component 134, such as a resistor, a capacitor, an inductor, a diode, a voltage regulator, or an active component, the first integrated circuit 114, an external integrated circuit 136, or a combination thereof. The stacking module integrated circuit 132 may be mounted, on the first side 128 of the flexible substrate 126, by the adhesive 116. The stacking module integrated circuit 132 can include an active side 151 and inactive side 153 opposite to the active side 151. The inactive side 153 is in direct contact with the adhesive 116. The stacking module integrated circuit 132 can also include a lateral sidewall 155, which is perpendicular to the active side 151 and to the inactive side 153. The electrical interconnect 118 may electrically connect the active side 151 of the stacking module integrated circuit 132 to the first side 128 of the flexible substrate 126.

A mold cap 138, such as an epoxy molding compound, may be formed on the stacking module integrated circuit 132, the electrical interconnect 118, and the first side 128 of the flexible substrate 126. The adhesive 116 may be applied on the mold cap 138, over the stacking module integrated circuit 132, for sticking the first side 128 to the top of the mold cap 138. The discrete component 134 may be electrically connected to the second side 130 of the flexible substrate 126. A package body 140, such as an epoxy molding compound, may be formed on the component side 104 for encapsulating the first integrated circuit 114, the electrical interconnect 118, and the internal stacking module 120. The second side 130 of the flexible substrate 126 is encapsulated in the package body 140. A top surface of the package body 140 is coplanar with and exposes external component contacts 142 on a portion of the second side 130 of the flexible substrate 126.

The external integrated circuit 136, such as a flip chip integrated circuit die, or an integrated circuit package, may be electrically connected to the external component contacts 142 by the chip interconnects 122. System interconnects 144, such as solder balls, solder columns, solder bumps, or stud humps, may be coupled to the system side 106 of the integrated circuit substrate 102. The chip interconnects 122 are attached to a portion of the second side 130 of the flexible substrate 126 facing the integrated circuit substrate 102.

It has been discovered that the internal stacking module 120 with the flexible substrate 126 may provide a highly efficient interconnect mechanism for stacking packages in a high volume manufacturing environment. The close proximity of the components, such as the first integrated circuit 114, the stacking module integrated circuit 132, the discrete component 134, and the external integrated circuit 136 may provide good signal quality and enable high frequency communication between the components. The integrated circuit package system 100 with the internal stacking module 120 of the present invention may also simplify the design of a printed circuit board (not shown) because fewer interconnects are required in the printed circuit board design. This aspect of the present invention may be known as a fan-in package-on-package (FI-POP) design.

Figure 2:
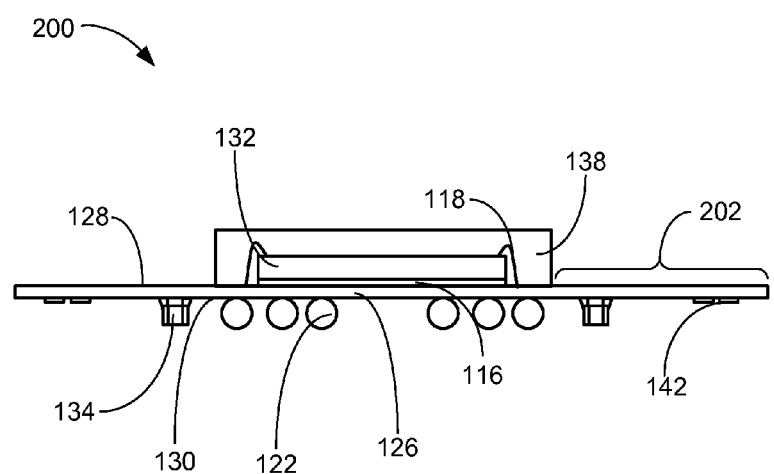
FIG. 2 is a cross-sectional view of an internal stacking module in an assembly phase of manufacture.

Referring now to FIG. 2, therein is shown a cross-sectional view of an internal stacking module 200 in an assembly phase of manufacture. The cross-sectional view of the internal stacking module 200 depicts the flexible substrate 126 having the first side 128 and the second side 130. The flexible substrate 126 may contain conductive material (not shown) for coupling between the stacking module integrated circuit 132, the discrete component 134, the chip interconnects 122, the external component contacts 142, or a combination thereof. The mold cap 138 may be formed on the stacking module integrated circuit 132 and the electrical interconnects 118.

In a later process step, a flexible extension 202 of the flexible substrate 126 may be bent around the mold cap 138. The flexible extension 202 may be attached to the top of the mold cap 138 by the adhesive 116, of FIG. 1. A side of the flexible extension 202 faces the lateral sidewall 155 and the active side 151 of the stacking module integrated circuit 132.

Figure 3:
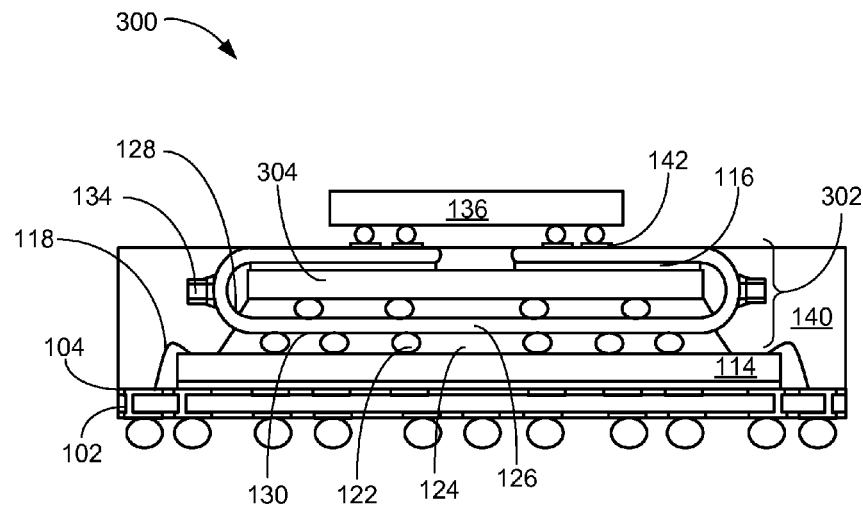
FIG. 3 is a cross-sectional view of an integrated circuit package system in a first alternative embodiment of the present invention.

Referring now to FIG. 3, therein is shown a cross-sectional view of an integrated circuit package system 300 in a first alternative embodiment of the present invention. The cross-sectional view of the integrated circuit package system 300 depicts the first integrated circuit 114 mounted over the integrated circuit substrate 102. An internal stacking module 302 may include the flexible substrate 126 having the first side 128 and the second side 130. The internal stacking module 302 may be coupled to the active side of the first integrated circuit 114 by the chip interconnects 122. The underfill material 124 may optionally be applied between the second side 130 of the flexible substrate 126 and the active side of the first integrated circuit 114.

A stacking module integrated circuit 304, such as a flip chip integrated circuit, may be coupled to the first side 128 of the flexible substrate 126 by the chip interconnects 122. The underfill material 124 may optionally be applied between the stacking module integrated circuit 304 and the first side 128 of the flexible substrate 126. The discrete component 134 may be coupled to the second side 130 of the flexible substrate 126. The adhesive 116 maybe positioned on the inactive side of the stacking module integrated circuit 304 for attaching the first side 128 of the flexible substrate 126. The package body 140 may be molded on the integrated circuit substrate 102, the first integrated circuit 114, the electrical interconnect 118, and the internal stacking module 302. The package body 140 may also be molded between the first side 128 of the flexible substrate 126 and the stacking module integrated circuit 304.

The package body 140 does not cover the external component contacts 142 on the second side 130 of the flexible substrate 126. The external integrated circuit 136 may be coupled to the external component contacts 142 by the chip interconnects 122.

Figure 4:
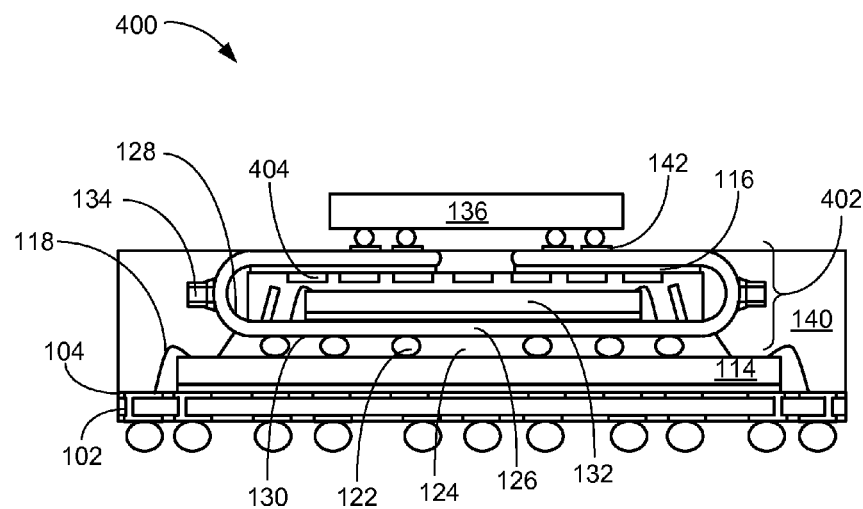
FIG. 4 is a cross-sectional view of an integrated circuit package system in a second alternative embodiment of the present invention.

Referring now to FIG. 4, therein is shown a cross-sectional view of an integrated circuit package system 400 in a second alternative embodiment of the present invention. The cross-sectional view of the integrated circuit package system 400 depicts the first integrated circuit 114 mounted over the integrated circuit substrate 102. An internal stacking module 402 may include the flexible substrate 126 having the first side 128 and the second side 130. The internal stacking module 402 may be coupled to the active side of the first integrated circuit 114 by the chip interconnects 122. The underfill material 124 may optionally be applied between the second side 130 of the flexible substrate 126 and the active side of the first integrated circuit 114.

The internal stacking module 402 may be formed by the flexible substrate 126 having the first side 128 and the second side 130. The first side 128 and the second side 130 may provide an electrical connection path between the stacking module integrated circuit 132, the discrete component 134, the first integrated circuit 114, the external integrated circuit 136, or the combination thereof. The stacking module integrated circuit 132 may be mounted, on the first side 128 of the flexible substrate 126, by the adhesive 116. The electrical interconnect 118 may couple the active side of the stacking module integrated circuit 132 to the first side 128 of the flexible substrate 126.

A conductive shield 404, such as an electromagnetic interference shield or a radio frequency shield, may be positioned over the stacking module integrated circuit 132 and electrically connected to the first side 128 of the flexible substrate 126. A sufficient spacing is maintained so that there is no electrical connection between the conductive shield 404 and the electrical interconnects 118.

The mold cap 138 may be formed on the conductive shield 404, the stacking module integrated circuit 132, the electrical interconnect 118, and the first side 128 of the flexible substrate 126. The adhesive 116 may be applied on the mold cap 138, over the stacking module integrated circuit 132, for sticking the first side 128 to the top of the mold cap 138. The discrete component 134 may be electrically connected to the second side 130 of the flexible substrate 126. The package body 140 may be formed on the component side 104, the first integrated circuit 114, the electrical interconnect 118, and the internal stacking module 402.

The package body 140 does not cover the external component contacts 142 on the second side 130 of the flexible substrate 126. The external integrated circuit 136 may be electrically connected to the external component contacts 142 by the chip interconnects 122.

Figure 5:
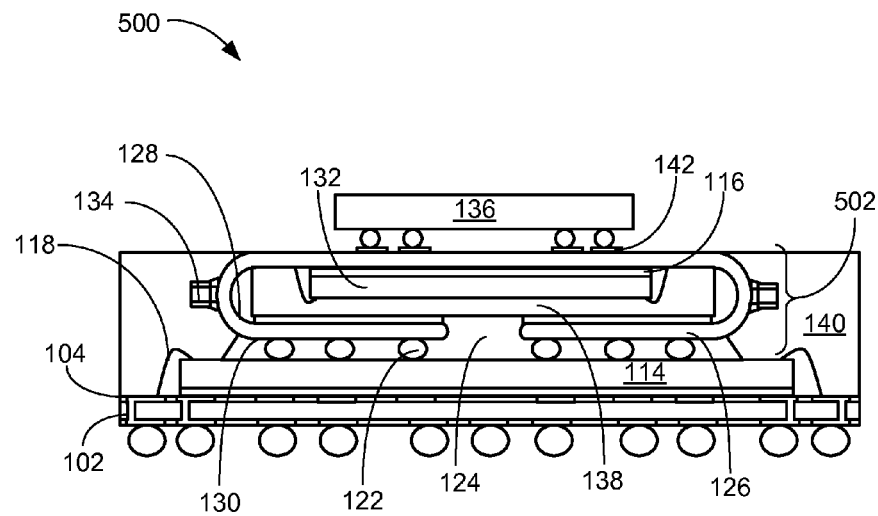
FIG. 5 is a cross-sectional view of an integrated circuit package system in a third alternative embodiment of the present invention.

Referring now to FIG. 5, therein is shown a cross-sectional view of an integrated circuit package system 500 in a third alternative embodiment of the present invention. The cross-sectional view of the integrated circuit package system 500 depicts the first integrated circuit 114 mounted over the integrated circuit substrate 102. An internal stacking module 502 may include the flexible substrate 126 having the first side 128 and the second side 130. The internal stacking module 502 may be coupled to the active side of the first integrated circuit 114 by the chip interconnects 122. The underfill material 124 may be applied between the second side 130 of the flexible substrate 126, the mold cap 138, and the active side of the first integrated circuit 114.

The internal stacking module 502 may be formed by the flexible substrate 126 having the first side 128 and the second side 130. The first side 128 and the second side 130 may provide an electrical connection path between the stacking module integrated circuit 132, the discrete component 134, the first integrated circuit 114, the external integrated circuit 136, or the combination thereof. The stacking module integrated circuit 132 may be mounted, on the first side 128 of the flexible substrate 126, by the adhesive 116. The electrical interconnect 118 may couple the active side of the stacking module integrated circuit 132 to the first side 128 of the flexible substrate 126. The internal stacking module 502 may be similar to the internal stacking module 120, of FIG. 1, but the position is inverted.

The mold cap 138 may be formed on the stacking module integrated circuit 132, the electrical interconnect 118, and the first side 128 of the flexible substrate 126. The adhesive 116 may be applied on the mold cap 138, over the stacking module integrated circuit 132, for sticking the first side 128 to the mold cap 138. The discrete component 134 may be electrically connected to the second side 130 of the flexible substrate 126. The package body 140 may be formed on the component side 104, the first integrated circuit 114, the electrical interconnect 118, and the internal stacking module 502.

The package body 140 does not cover the external component contacts 142 on the second side 130 of the flexible substrate 126. The external integrated circuit 136 may be electrically connected to the external component contacts 142 by the chip interconnects 122.

Figure 6:
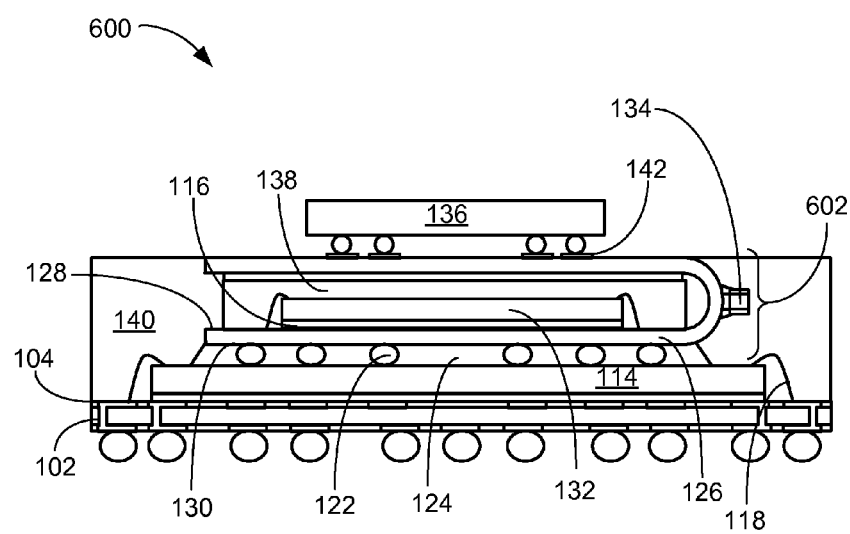
FIG. 6 is a cross-sectional view of an integrated circuit package system in a fourth alternative embodiment of the present invention.

Referring now to FIG. 6, therein is shown a cross-sectional view of an integrated circuit package system 600 in a fourth alternative embodiment of the present invention. The cross-sectional view of the integrated circuit package system 600 depicts the first integrated circuit 114 mounted over the integrated circuit substrate 102. An internal stacking module 602 may include the flexible substrate 126 having the first side 128 and the second side 130. The internal stacking module 602 may be coupled to the active side of the first integrated circuit 114 by the chip interconnects 122. The underfill material 124 may optionally be applied between the second side 130 of the flexible substrate 126 and the active side of the first integrated circuit 114.

The internal stacking module 602 may be formed by the flexible substrate 126 having the first side 128 and the second side 130. The first side 128 and the second side 130 may provide an electrical connection path between the stacking module integrated circuit 132, the discrete component 134, the first integrated circuit 114, the external integrated circuit 136, or the combination thereof. The stacking module integrated circuit 132 may be mounted, on the first side 128 of the flexible substrate 126, by the adhesive 116. The electrical interconnect 118 may couple the active side of the stacking module integrated circuit 132 to the first side 128 of the flexible substrate 126.

The mold cap 138 may be formed on the stacking module integrated circuit 132, the electrical interconnect 118, and the first side 128 of the flexible substrate 126. The adhesive 116 may be applied on the mold cap 138, over the stacking module integrated circuit 132, for sticking the first side 128 to the top of the mold cap 138. The discrete component 134 may be electrically connected to the second side 130 of the flexible substrate 126. The package body 140 may be formed on the component side 104, the first integrated circuit 114, the electrical interconnect 118, and the internal stacking module 602.

The package body 140 does not cover the external component contacts 142 on the second side 130 of the flexible substrate 126. The external integrated circuit 136 may be electrically connected to the external component contacts 142 by the chip interconnects 122.

Figure 7:
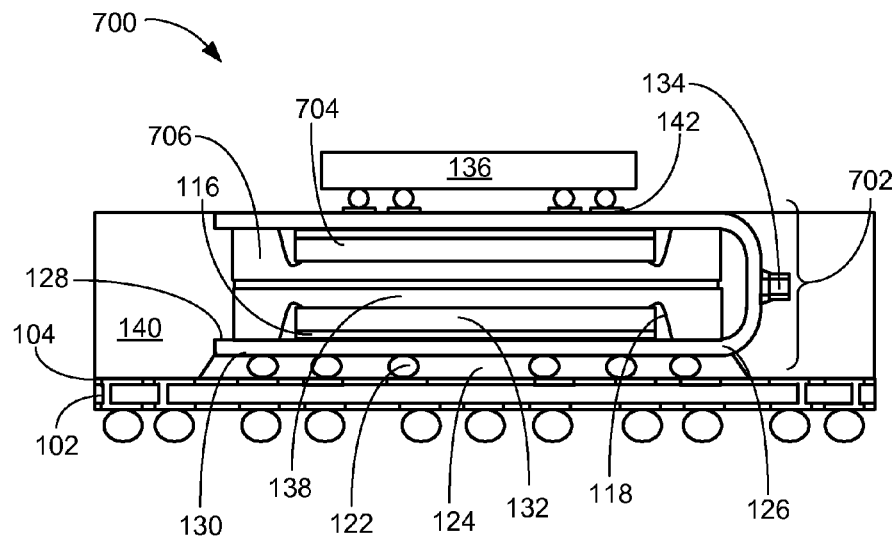
FIG. 7 is a cross-sectional view of an integrated circuit package system in a fifth alternative embodiment of the present invention.

Referring now to FIG. 7, therein is shown a cross-sectional view of an integrated circuit package system 700 in a fifth alternative embodiment of the present invention. The cross-sectional view of the integrated circuit package system 700 depicts an internal stacking module 702 which may include the flexible substrate 126 having the first side 128 and the second side 130. The internal stacking module 702 may be coupled to the integrated circuit substrate 102 by the chip interconnects 122. The underfill material 124 may optionally be applied between the second side 130 of the flexible substrate 126 and the integrated circuit substrate 102.

The internal stacking module 702 may be formed by the flexible substrate 126 having the first side 128 and the second side 130. The first side 128 and the second side 130 may provide an electrical connection path between the stacking module integrated circuit 132, the discrete component 134, a second stacking module integrated circuit 704, the external integrated circuit 136, or the combination thereof. The stacking module integrated circuit 132 and the second stacking module integrated circuit 704 may be mounted, on the first side 128 of the flexible substrate 126, by the adhesive 116. The electrical interconnect 118 may couple the active side of the stacking module integrated circuit 132 and the active side of the second stacking module integrated circuit 704 to the first side 128 of the flexible substrate 126.

The mold cap 138 may be formed on the stacking module integrated circuit 132, the electrical interconnect 118, and the first side 128 of the flexible substrate 126. A second mold cap 706 may be formed on the second stacking module integrated circuit 704, the electrical interconnect 118, and the first side 128 of the flexible substrate 126. The adhesive 116 may be applied on the mold cap 138, over the stacking module integrated circuit 132, for sticking the top of the second mold cap 706 to the top of the mold cap 138. This embodiment of the present invention may provide a vertical stack, of the stacking module integrated circuit 132 and the second stacking module integrated circuit 704, within the internal stacking module 702.

The discrete component 134 may be electrically connected to the second side 130 of the flexible substrate 126. The package body 140 may be formed on the component side 104, the underfill material 124, and the internal stacking module 702. If the underfill material 124 is not present, the package body 140 will also be on the chip interconnects 122.

The package body 140 does not cover the external component contacts 142 on the second side 130 of the flexible substrate 126. The external integrated circuit 136 may be electrically connected to the external component contacts 142 by the chip interconnects 122.

Figure 8:
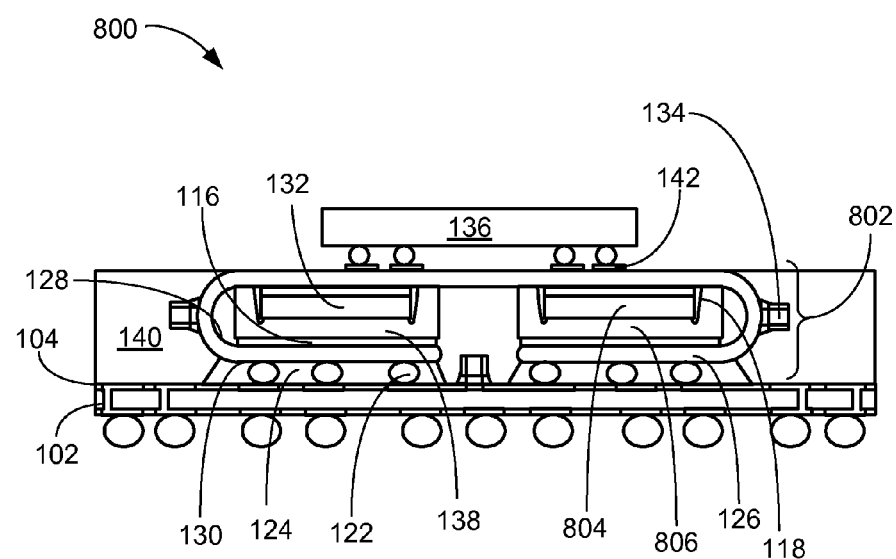
FIG. 8 is a cross-sectional view of an integrated circuit package system in a sixth alternative embodiment of the present invention.

Referring now to FIG. 8, therein is shown a cross-sectional view of an integrated circuit package system 800 in a sixth alternative embodiment of the present invention. The cross-sectional view of the integrated circuit package system 800 depicts an internal stacking module 802 which may include the flexible substrate 126 having the first side 128 and the second side 130. The internal stacking module 802 may be coupled to the integrated circuit substrate 102 by the chip interconnects 122. The underfill material 124 may optionally be applied between the second side 130 of the flexible substrate 126 and the integrated circuit substrate 102.

The internal stacking module 802 may be formed by the flexible substrate 126 having the first side 128 and the second side 130. The first side 128 and the second side 130 may provide an electrical connection path between the stacking module integrated circuit 132, the discrete component 134, a second stacking module integrated circuit 804, the external integrated circuit 136, or the combination thereof. The stacking module integrated circuit 132 and the second stacking module integrated circuit 804 may be mounted, on the first side 128 of the flexible substrate 126, by the adhesive 116. The electrical interconnect 118 may couple the active side of the stacking module integrated circuit 132 and the active side of the second stacking module integrated circuit 804 to the first side 128 of the flexible substrate 126.

The mold cap 138 may be formed on the stacking module integrated circuit 132, the electrical interconnect 118, and the first side 128 of the flexible substrate 126. A second mold cap 806 may be formed on the second stacking module integrated circuit 804, the electrical interconnect 118, and the first side 128 of the flexible substrate 126. The adhesive 116 may be applied on the mold cap 138, over the stacking module integrated circuit 132, for sticking the first side 128 to the top of the mold cap 138. Likewise the adhesive 116 may be applied on the second mold cap 806, over the second stacking module integrated circuit 804, for sticking the first side 128 to the top of the second mold cap 806.

This embodiment of the present invention may provide a horizontal mounting, of the stacking module integrated circuit 132 and the second stacking module integrated circuit 804, within the internal stacking module 802. An additional position may be provided for the discrete component 134 by positioning it in the opening of the flexible substrate 126 between the mold cap 138 and the second mold cap 806. If the underfill material 124 is not used in this embodiment, the space would be filled by the package body 140.

The discrete component 134 may be electrically connected to the second side 130 of the flexible substrate 126. The package body 140 may be formed on the component side 104, the underfill material 124, and the internal stacking module 802. The package body 140 does not cover the external component contacts 142 on the second side 130 of the flexible substrate 126. The external integrated circuit 136 may be electrically connected to the external component contacts 142 by the chip interconnects 122.

Figure 9:
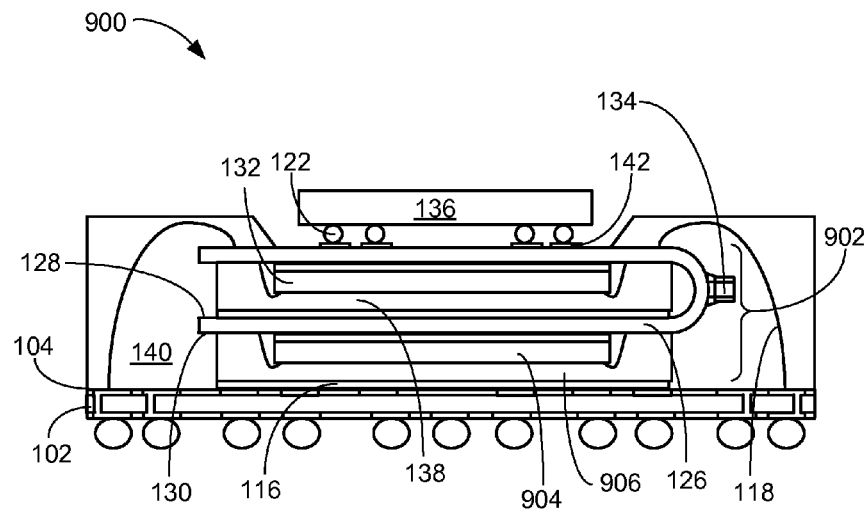
FIG. 9 is a cross-sectional view of an integrated circuit package system in a seventh alternative embodiment of the present invention.

Referring now to FIG. 9, therein is shown a cross-sectional view of an integrated circuit package system 900 in a seventh alternative embodiment of the present invention. The cross-sectional view of the integrated circuit package system 900 depicts an internal stacking module 902 which may include the flexible substrate 126 having the first side 128 and the second side 130. The internal stacking module 902 may be coupled to the integrated circuit substrate 102 by the electrical interconnects 118.

The internal stacking module 902 may be formed by the flexible substrate 126 having the first side 128 and the second side 130. The first side 128 and the second side 130 may provide an electrical connection path between the stacking module integrated circuit 132, the discrete component 134, a second stacking module integrated circuit 904, the external integrated circuit 136, or the combination thereof. The stacking module integrated circuit 132 may be mounted on the first side 128 of the flexible substrate 126 by the adhesive 116. While the second stacking module integrated circuit 904 may be mounted on the second side 130 of the flexible substrate 126 by the adhesive 116. The electrical interconnect 118 may couple the active side of the stacking module integrated circuit 132 to the first side 128 of the flexible substrate 126 and the active side of the second stacking module integrated circuit 904 to the second side 130.

The mold cap 138 may be formed on the stacking module integrated circuit 132, the electrical interconnect 118, and the first side 128 of the flexible substrate 126. A second mold cap 906 may be formed on the second stacking module integrated circuit 904, the electrical interconnect 118, and the second side 130 of the flexible substrate 126. The adhesive 116 may be applied on the mold cap 138, over the stacking module integrated circuit 132, for sticking the first side 128 to the top of the mold cap 138. Likewise the adhesive 116 may be applied on the second mold cap 906, over the second stacking module integrated circuit 804, for sticking the top of the second mold cap 906 to the component side 104 of the integrated circuit substrate 102.

This embodiment of the present invention may provide a vertical mounting, of the stacking module integrated circuit 132 and the second stacking module integrated circuit 904, within the internal stacking module 902. The discrete component 134 may be electrically connected to the second side 130 of the flexible substrate 126. The package body 140 may be formed on the component side 104, the electrical interconnects 118, and the internal stacking module 902. The package body 140 does not cover the external component contacts 142 on the second side 130 of the flexible substrate 126. The external integrated circuit 136 may be electrically connected to the external component contacts 142 by the chip interconnects 122.

Figure 10:
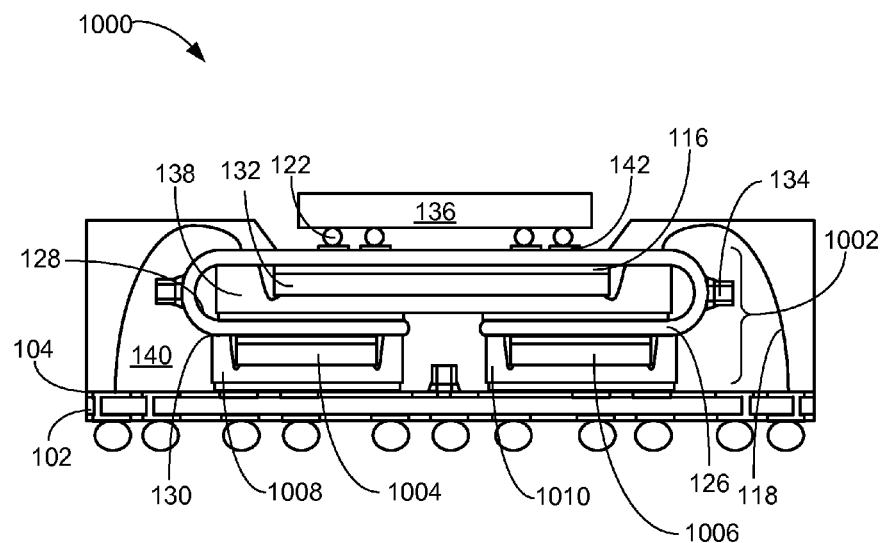
FIG. 10 is a cross-sectional view of an integrated circuit package system in an eighth alternative embodiment of the present invention.

Referring now to FIG. 10, therein is shown a cross-sectional view of an integrated circuit package system 1000 in an eighth alternative embodiment of the present invention. The cross-sectional view of the integrated circuit package system 1000 depicts an internal stacking module 1002 which may include the flexible substrate 126 having the first side 128 and the second side 130. The internal stacking module 1002 may be coupled to the integrated circuit substrate 102 by the electrical interconnects 118.

The internal stacking module 1002 may be formed by the flexible substrate 126 having the first side 128 and the second side 130. The first side 128 and the second side 130 may provide an electrical connection path between the stacking module integrated circuit 132, the discrete component 134, a second stacking module integrated circuit 1004, a third stacking module integrated circuit 1006, the external integrated circuit 136, or the combination thereof. The stacking module integrated circuit 132 may be mounted on the first side 128 of the flexible substrate 126 by the adhesive 116. While the second stacking module integrated circuit 1004 and the third stacking module integrated circuit 1006 may be mounted on the second side 130 of the flexible substrate 126 by the adhesive 116. The electrical interconnect 118 may couple the active side of the stacking module integrated circuit 132 to the first side 128 of the flexible substrate 126 and the active side of the second stacking module integrated circuit 1004 and the third stacking module integrated circuit 1006 to the second side 130.

The mold cap 138 may be formed on the stacking module integrated circuit 132, the electrical interconnect 118, and the first side 128 of the flexible substrate 126. A second mold cap 1008 may be formed on the second stacking module integrated circuit 1004, the electrical interconnect 118, and the second side 130 of the flexible substrate 126. A third mold cap 1010 may be formed on the third stacking module integrated circuit 1006, the electrical interconnect 118, and the second side 130 of the flexible substrate 126.

The adhesive 116 may be applied on the mold cap 138 for sticking the first side 128 to the top of the mold cap 138. Likewise the adhesive 116 may be applied on the second mold cap 1008 for sticking the top of the second mold cap 1008 to the component side 104 of the integrated circuit substrate 102. Further the adhesive 116 may be applied on the third mold cap 1010 for sticking the top of the third mold cap 1010 to the component side 104 of the integrated circuit substrate 102.

This embodiment of the present invention may provide a vertical mounting, of the stacking module integrated circuit 132 over the second stacking module integrated circuit 1004 and the third stacking module integrated circuit 1006 within the internal stacking module 1002. The discrete component 134 may be electrically connected to the second side 130 of the flexible substrate 126. An additional position may be provided for the discrete component 134 by positioning it in the opening of the flexible substrate 126 between the second mold cap 1008 and the third mold cap 1010. In this embodiment, the space would be filled by the package body 140.

The package body 140 may be formed on the component side 104, the electrical interconnects 118, and the internal stacking module 1002. The package body 140 does not cover the external component contacts 142 on the second side 130 of the flexible substrate 126. The external integrated circuit 136 may be electrically connected to the external component contacts 142 by the chip interconnects 122.

Figure 11:
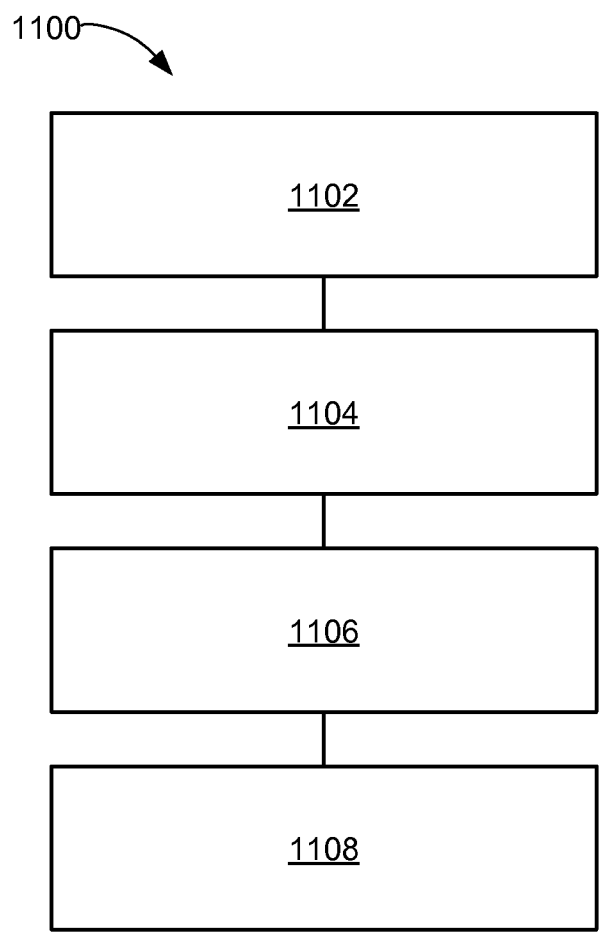
FIG. 11 is a flow chart of an integrated circuit package system for manufacturing the integrated circuit package system with internal stacking module, in an embodiment of the present invention.

Referring now to FIG. 11, therein is shown a flow chart of an integrated circuit package system 1100 for manufacturing the integrated circuit package system 100 with the internal stacking module 120, in an embodiment of the present invention. The system 1100 includes providing an integrated circuit substrate in a block 1102; forming an internal stacking module coupled to the integrated circuit substrate including: forming a flexible substrate, coupling a stacking module integrated circuit to the flexible substrate, and bending a flexible extension over the stacking module integrated circuit in a block 1104; and molding a package body on the integrated circuit substrate and the internal stacking module in a block 1106.

It has been discovered that the present invention thus has numerous aspects.

An aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system with internal stacking module of the present invention furnishes important and heretofore unknown and unavailable solutions, capabilities, and functional aspects for fabricating integrated circuit packages having a built-in package stacking capability. The resulting processes and configurations are straightforward, cost-effective, uncomplicated, highly versatile and effective, can be surprisingly and unobviously implemented by adapting known technologies, and are thus readily suited for efficiently and economically manufacturing multi-function integrated circuit devices, such as system-in-package (SIP), fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system including:
   providing an integrated circuit substrate;
   forming an internal stacking module coupled to the integrated circuit substrate including:
      forming a flexible substrate having a first side and a second side opposite the first side,
      coupling a stacking module integrated circuit to the flexible substrate, the stacking module integrated circuit having an inactive side, a lateral sidewall, and an active side,
      forming a mold cap on the stacking module integrated circuit and the flexible substrate,
      applying an adhesive over the mold cap, and
      bending a flexible extension over the stacking module integrated circuit, the adhesive attached between the flexible extension and the mold cap, the flexible extension extending from the flexible substrate, a side of the flexible extension facing the lateral sidewall and the active side;
   mounting a chip interconnect to a portion of the second side of the flexible substrate facing the integrated circuit substrate; and
   molding a package body on the integrated circuit substrate and the internal stacking module including a portion of the second side encapsulated in the package body and a top surface of the package body coplanar with a portion of the second side of the flexible substrate exposed from the package body.

2. The method as claimed in claim 1 further comprising mounting a first integrated circuit on the integrated circuit substrate and under the internal stacking module.

3. The method as claimed in claim 1 further comprising coupling a discrete component to the flexible substrate.

4. The method as claimed in claim 1 further comprising positioning a conductive shield around the stacking module integrated circuit.

5. The method as claimed in claim 1 further comprising mounting a second stacking module integrated circuit on the second side of the flexible substrate.

6. A method of manufacturing an integrated circuit package system including:
   providing an integrated circuit substrate;
   forming an internal stacking module coupled to the integrated circuit substrate including:
      forming a flexible substrate having a first side and a second side opposite to the first side, the second side including an external component,
      coupling a stacking module integrated circuit to the flexible substrate, the stacking module integrated circuit having an inactive side, a lateral sidewall, and an active side,
      forming a mold cap on the stacking module integrated circuit and the flexible substrate,
      applying an adhesive over mold cap, and
      bending a flexible extension over the stacking module integrated circuit, the adhesive attached between the flexible extension and the mold cap, the flexible extension extending from the flexible substrate, a side of the flexible extension facing the lateral sidewall and the active side;
   mounting a chip interconnect to a portion of the second side of the flexible substrate facing the integrated circuit substrate; and
   molding a package body on the integrated circuit substrate and the internal stacking module including a portion of the second side encapsulated in the package body and a top surface of the package body coplanar with a portion of the second side of the flexible substrate exposed from the package body.

7. The method as claimed in claim 6 further comprising:
   mounting a first integrated circuit on the integrated circuit substrate and under the internal stacking module; and
   coupling an electrical interconnect between the first integrated circuit and the component contact.

8. The method as claimed in claim 6 further comprising coupling a discrete component to the flexible substrate, the discrete component includes a resistor, a capacitor, an inductor, a voltage regulator, an active device, or a combination thereof.

9. The method as claimed in claim 6 further comprising positioning a conductive shield around the stacking module integrated circuit, the conductive shield forms an electromagnetic interference shield or a radio frequency shield around the stacking module integrated circuit.

10. The method as claimed in claim 6 further comprising mounting a second stacking module integrated circuit on the second side of the flexible substrate.

11. An integrated circuit package system includes:
an integrated circuit substrate;
an internal stacking module coupled to the integrated circuit substrate includes:
a flexible substrate having a first side and a second side opposite the first side,
a stacking module integrated circuit coupled to the flexible substrate, the stacking module integrated circuit having an inactive side, a lateral sidewall, and an active side,
a mold cap formed on the stacking module integrated circuit and the flexible substrate,
an adhesive applied over the mold cap, and
a flexible extension over the stacking module integrated circuit, the adhesive attached between the flexible extension and the mold cap, the flexible extension extending from the flexible substrate, a side of the flexible extension facing the lateral sidewall and the active side;
a chip interconnect attached to a portion of the second side of the flexible substrate facing the integrated circuit substrate; and
a package body on the integrated circuit substrate and the internal stacking module includes a portion of the second side encapsulated in the package body and a top surface of the package body coplanar with a portion of the second side of the flexible substrate exposed from the package body.

12. The system as claimed in claim 11 further comprising a first integrated circuit mounted on the integrated circuit substrate and under the internal stacking module.

13. The system as claimed in claim 11 further comprising a discrete component coupled to the flexible substrate.

14. The system as claimed in claim 11 further comprising a conductive shield around the stacking module integrated circuit.

15. The system as claimed in claim 11 further comprising a second stacking module integrated circuit mounted on the second side of the flexible substrate.

16. The system as claimed in claim 11 further comprising:
a component contact on the integrated circuit substrate;
a system contact on the integrated circuit substrate; and
an external component contact on the second side of the flexible substrate.

17. The system as claimed in claim 16 further comprising:
a first integrated circuit on the integrated circuit substrate and under the internal stacking module; and
an electrical interconnect between the first integrated circuit and the component contact.

18. The system as claimed in claim 16 further comprising a discrete component coupled to the flexible substrate, the discrete component includes a resistor, a capacitor, an inductor, a voltage regulator, an active device, or a combination thereof.

19. The system as claimed in claim 16 further comprising a conductive shield around the stacking module integrated circuit, the conductive shield includes an electro-magnetic interference shield or a radio frequency shield around the stacking module integrated circuit.

20. The system as claimed in claim 16 further comprising:
a second stacking module integrated circuit on the second side of the flexible substrate; and
an electrical interconnect between the second side of the flexible substrate and the component contact on the integrated circuit substrate.

* * * * *

UNITED STATES PATENT AND TRADEMARK OFFICE
CERTIFICATE OF CORRECTION

PATENT NO. : 9,030,006 B2  Page 1 of 1
APPLICATION NO. : 13/563598
DATED : May 12, 2015
INVENTOR(S) : Chow et al.

It is certified that error appears in the above-identified patent and that said Letters Patent is hereby corrected as shown below:

In the Specification:

Column 4, line 53, delete "humps, may" and insert therefor --bumps, may--

Signed and Sealed this
Twelfth Day of April, 2016

Michelle K. Lee
*Director of the United States Patent and Trademark Office*